US 8,458,547 B2
Jun. 4, 2013

(12) United States Patent
Viswanathan et al.

(54) METHOD FOR CONSTRUCTING A HISTOGRAM

(75) Inventors: Krishnamurthy Viswanathan, Mountain View, CA (US); Ram Swaminathan, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 323 days.

(21) Appl. No.: 12/912,688

(22) Filed: Oct. 26, 2010

(65) Prior Publication Data

US 2012/0102377 A1    Apr. 26, 2012

(51) Int. Cl.
*G06F 11/00* (2006.01)

(52) U.S. Cl.
USPC ............................ 714/746; 714/747

(58) Field of Classification Search
USPC ................ 714/748, 746, 747, 759, 774
See application file for complete search history.

(56) References Cited

U.S. PATENT DOCUMENTS

| | | | |
|---|---|---|---|
| 6,278,989 B1 * | 8/2001 | Chaudhuri et al. | 1/1 |
| 8,014,973 B1 * | 9/2011 | Huang | 702/180 |
| 2008/0208856 A1 | 8/2008 | Lim et al. | |
| 2009/0136130 A1 | 5/2009 | Piper | |
| 2010/0153328 A1 * | 6/2010 | Cormode et al. | 706/52 |
| 2010/0332494 A1 * | 12/2010 | Graefe | 707/759 |

OTHER PUBLICATIONS

Surajit Chaudhuri, "An Overview of Query Optimization in Relational Systems", Microsoft Research.
H. V. Jagadish, et al., "Choosing Bucket Boundaries for Histograms", Computer Systems Research Group, Paper No. 218, pp. 1-25.
Allen Gersho, "On the Structure of Vector Quantizers", IEEE, Mar. 1982, vol. IT-28, No. 2, pp. 157-166.
John H. Conway, et al., "A Fast Encoding Method for Lattice Codes and Quantizers", IEEE, Nov. 1983, vol. IT-29, No. 6, pp. 820-824.
H. V. Jagadish, et al., "Optimal Histograms with Quality Guarantees", Proceedings fo the 24th VLDB Conference, New York, USA, 1998, pp. 275-286.
Viswanath Poosala, "Improved Histograms for Selectivity Estimation of Range Predicates", pp. 294-305.

* cited by examiner

*Primary Examiner* — Dieu-Minh Le

(57) ABSTRACT

A method for constructing a histogram can include sampling attributes in a column of a database on a server and determining a bucket set for the histogram based on a number of buckets that represents a distribution of the attributes with minimum error. A bucket in the bucket set includes boundaries and an approximation of a count of attributes falling within the boundaries. The method further includes determining a precision for encoding the approximation, such that the histogram having the bucket set fits within a storage limit on a tangible computer-readable medium. The histogram can then be stored for the database on a tangible computer-readable medium by encoding the approximation with the precision.

20 Claims, 4 Drawing Sheets ns of the statistics of the data resident in a table.
METHOD FOR CONSTRUCTING A HISTOGRAM

BACKGROUND

Histograms are used in databases as lossily compressed representations of the statistics of the data resident in a table. The statistics obtained from the histograms are used for query optimization and in some cases, approximate query processing.

Database modules directed to query optimization tasks often utilize estimates of query result sizes. For example, query optimizers select the most efficient access plan for a query based on estimated costs. These costs can be in turn based on estimates of intermediate result sizes. Sophisticated user interfaces also use approximations of result sizes as feedback to a user before a query is actually executed. Such feedback helps to detect errors in queries or misconceptions about the database. However, these statistics merely approximate the distribution of data values in attributes of the relations, and often are based on assumptions, such as a uniform distribution of attribute values, that often do not hold. Therefore, the statistics can represent an inaccurate picture of the actual contents of the database.

DETAILED DESCRIPTION

Figure 1:
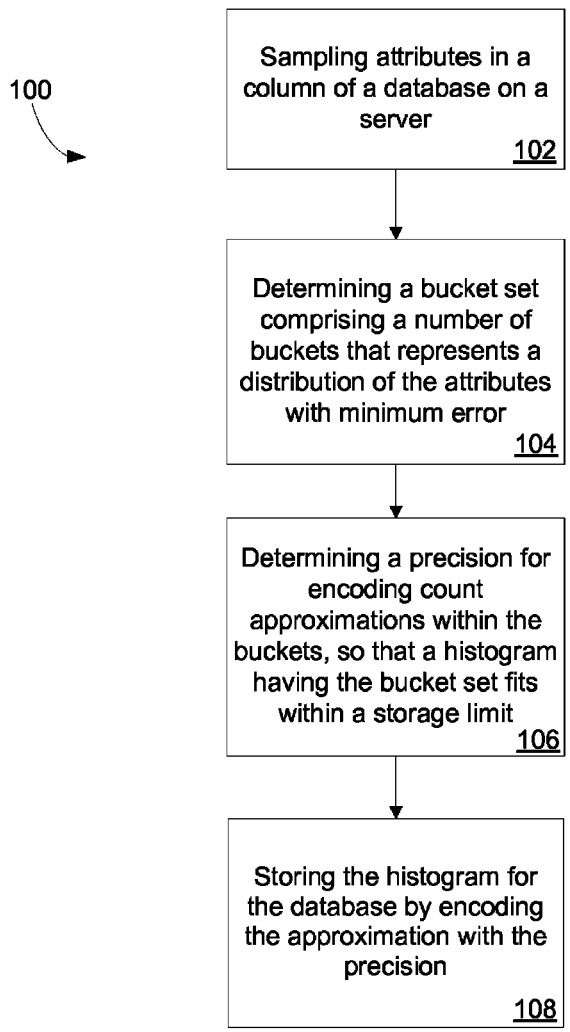
FIG. 1 is a flow diagram illustrating a method according to an example of the present technology.

Reference will now be made to the examples illustrated, and specific language will be used herein to describe the same. Features and advantages of the technology will be apparent from the detailed description which follows, taken in conjunction with the accompanying drawings, which together illustrate, by way of example, features of the technology.

Examples are presented below for constructing and storing representations of statistical aspects of data in a database or other relational construct. A particular example is directed to construction of a histogram of an attribute in a database column given a storage constraint on the histogram. As used herein, the term "column" refers to a structure of a database, where said database can be considered to be organized as a table with rows and columns. In a particular example, a database comprises records organized in rows and including categories of data, where the data in a category constitutes a column. However, it should be understood that the discussion herein is not limited to a particular relational database system.

For purposes of the subject technology, "attributes" can include integer data as well as non-numerical data (e.g. text) that has been converted into an integer code and stored in the column. Histograms typically partition the set of attribute values into "buckets" (i.e. histogram components) comprising one or more boundaries that define a range of potential attribute values. The number of occurrences in the column of each of the attribute values (i.e. value frequency) falling within the boundaries of a bucket can be represented by a single rational number, referred to herein as a "count" or "bucket count".

A histogram can be used to estimate the likely result size for a particular query of the database. For example, to estimate the result size of a predicate having a range, an estimation routine can be employed to identify each bucket having boundaries that intersect with that range. Then, using specified approximation formulas, the routine estimates the number of values in each identified bucket that satisfy the range predicate, along with the frequency of each such value. These frequencies are summed over the identified buckets to yield the estimate of the result size.

One challenge presented by histogram construction for database query optimization is the construction of a representation of the data within a given amount of storage space so that relevant statistics can be gleaned with minimal error. While considerable effort has been spent in optimizing the boundaries of the buckets, much less attention has been paid to optimizing the number of bits that are spent in representing the bucket count in storage space. The latter consideration can be equally crucial, in that the ultimate constraint on the histogram typically is available storage space. For example, in a large database (i.e. having a large number of attributes, n) obtaining a representation of the data that both exhibits low error and can be stored in a limited space can present a challenge.

As shown in FIG. 1, one example of a method 100 for constructing a histogram can include a step 102 of sampling attributes in a column of a database on a server, and then a step 104 of determining a bucket set for the histogram based on a number of buckets that represents a distribution of the attributes with minimum error. The buckets in the bucket set include boundaries and an also an approximation of a count of attributes falling within the boundaries. The method can further include the step 106 of determining a precision for encoding the approximation, such that the histogram having the bucket set fits within a storage limit, e.g. for storage on a tangible computer-readable medium. The histogram can then be stored 108 for the database on a tangible computer-readable medium by encoding the approximation with the precision. Techniques are further outlined below to trade-off between the number of bits used for representing each bucket count and the total number of buckets used, so as to minimize the error in the histogram representation while adhering to the storage constraint.

Once constructed, a histogram can be stored for use in query-related operations. For example, a database system catalog can include one or more histograms constructed from tables in the database. The histogram can be reconstructed or otherwise updated to reflect changes in database. Updating can be done according to a schedule appropriate to the database. Storage of the histogram can involve storing particular descriptive values associated with the histogram and the underlying statistics. For example, a histogram can be represented in storage by values for at least one boundary for each bucket and a representation of the attribute counts in each bucket. All buckets and bucket counts can be included, or alternatively only non-zero counts and their associated buckets may be included. According to an example, the representation of the bucket count can be a single-value scalar representation, such as a mean (e.g. arithmetic mean, geometric mean), a median or a mode. In a particular example, the frequencies in a bucket are represented in storage by an average of the frequencies. Other bucket properties can be stored using sufficient information to characterize the histogram while minimizing size. For example, boundaries of buckets can be represented using either the upper boundary or lower boundary of each bucket.

In one example, a technique can comprise constructing a histogram that represents the bucket counts up to a certain fixed precision. Limiting count precision can introduce further error in the representation of the counts of the values. However, the storage savings obtained in the number of bits needed to represent the bucket counts can be used to increase the number of buckets and thereby reduce the overall error.

An attribute occurs in a column of a database. A method for constructing a histogram can include sampling attributes in the column of the database on a server and determining a bucket set for the histogram based on a number of buckets that represents a distribution of the attributes with minimum error. Let $U=\{1, 2, \ldots k\}$, denote the ordered set of values that an attribute in question can take. This abstraction allows for instances where the attribute values are not just integers, but arise from any set that permits a total ordering. Such an abstraction is particularly useful when the queries in question are range queries. Let n denote the number of rows in the column. Let vector $\mathbf{c} = (c_1, c_2, \ldots c_k) \in \mathbb{Z}^k$ such that $$c_i \geq \sum_{i=1}^{k} c_i = n$$

denote the number of times each value appears in the column (the integer $c_i$ is the number of times i appears in the column). In one example, a histogram is an approximate representation of c in which the set U is partitioned into a collection of non-overlapping intervals, i.e. buckets. Let the bucket boundaries for the B buckets be $1 \leq b_1 < b_2 < \ldots b_{B-1} < b_B = k$. For $1 \leq j \leq B$, the jth bucket, denoted by $\mathcal{B}_j$, is the set of values defined by the boundaries, i.e. $\{b_{j-1}+1, b_{j-1}+2, \ldots b_j\}$. Once the bucket boundaries are established, the counts of the attribute values in each bucket are approximated by a single rational number. For example, for all $i \in \mathcal{B}_j$, the counts $c_i$ can be approximated by a single rational number $\hat{c}_j$. Accordingly, the approximate histogram representation $\hat{\mathbf{c}}$ is a vector of length k obtained by replacing $c_i$ (where $1 \leq i \leq k$ and is a member of $\mathcal{B}_j$) in $\mathbf{c}$ by $\hat{c}_j$. In a particular example, $\hat{c}_j$ is set to be the arithmetic mean of the counts of all the values in bucket j. However, other choices such as the median or mode may be used. The quantity $\hat{c}_j$ can then be stored as a representative approximation of the bucket count in bucket j.

The error in the histogram representation can be measured in several ways. For example, a squared error metric can be used as follows. For any two length-k vectors $x=(x_1, x_2, \ldots, x_k)$, $y=(y_1, y_2, \ldots, y_k)$, the error in representing x with y is given by $$d(x, y) = \sum_{i=1}^{k} (x_i - y_i)^2 \quad [\text{Eq. 1}]$$

This is the average squared error incurred in the case of a uniform distribution on all possible point queries. Other choices of error metrics such as weighted squared error, absolute error and worst-case error can be accommodated in the following exposition. For purposes of the following discussion, the present technology is described for the case of squared error. In one aspect, an outcome of the method comprises constructing $\hat{\mathbf{c}}$ while minimizing the squared error loss $d(\mathbf{c}, \hat{\mathbf{c}})$ while complying with a given storage constraint. In another aspect, an outcome is minimizing the storage space needed to store $\hat{\mathbf{c}}$ while complying with a constraint on the error metric. The space used to store $\hat{\mathbf{c}}$ depends on the precise coding scheme employed. As noted above, one approach for storing $\hat{\mathbf{c}}$ is to store the bucket boundaries $b_1, b_2, \ldots, b_{B-1}$ and the values of the counts for each bucket, namely $\{\hat{c}_j\}_{j=1}^{B}$. In a particular example, it can suffice to store one boundary for each bucket, e.g. the upper boundary or alternatively a lower boundary. Accordingly, the histogram representation can include B−1 boundaries, and to represent the bucket boundaries calls for at most $$\log\binom{k+B-1}{B-1} \leq (B-1)\log k \quad [\text{Eq. 2}]$$

bits (note that the notation "log" as used herein denotes a base 2 logarithm). The left hand side is the fewest number of bits necessary for a lossless representation that uses a fixed-length coding scheme. A fixed-length coding scheme uses the same number of bits to represent all possible combinations of bucket numbers and boundaries. The right hand side is achieved by representing each of the B−1 bucket boundaries using log k bits. The discussion henceforth assumes use of this coding scheme. In accordance with this scheme, given a total storage budget of R bits, the number of bits available for storing the approximate counts $\{\hat{c}_j\}_{j=1}^{B}$ is R−(B−1) log k bits. A common approach is to represent the approximate counts exactly and choose the bucket quantity B so as to meet the storage constraint of R bits. However, in accordance with the examples described herein one can choose encoding schemes for the approximate counts while optimizing the bucket quantity B and the bucket boundaries so as to minimize $d(\mathbf{c}, \hat{\mathbf{c}})$. For example, the method can include determining a precision for encoding the approximation of counts, such that the histogram having the bucket set fits within a storage limit.

In one example, each bucket count $\hat{c}_j$ can be represented up to a given precision (denoted $\Delta$ with respect to this example). In a particular aspect, let $\hat{c}_j = m_j \Delta$, where $m_j$ is a non-negative integer. Let $r = \lceil n/\Delta \rceil + 1$ denote the maximum number of values that $m_j$ can take. Then, where $\{\hat{c}_j\}_{j=1}^{B}$ is represented by describing each $m_j$ separately, the number of bits needed is B log r. From Eq. 2, the total number of bits needed to represent $\hat{\mathbf{c}}$ is (B−1) log k+B log r. With only R bits available, the space constraint on storage of $\hat{\mathbf{c}}$ is $$(B-1)\log k + B \log r \leq R. \quad [\text{Eq. 3}]$$

In an aspect of the example, $d(\mathbf{c}, \hat{\mathbf{c}})$ is minimized subject to the constraint of Eq. 3. Where $\hat{c}$ is a histogram having a bucket set $\{\mathcal{B}_j\}$ comprising a quantity B of buckets $$d(c, \hat{c}) = \sum_{j=1}^{B} \sum_{i \in \mathcal{B}_j} (c_i - \hat{c}_j)^2 \quad [\text{Eq. 4}]$$

where $\hat{c}_j = m_j \Delta$ for some integer $0 \leq m_j \leq r$. The precision used to represent each count is a source of error in the histogram representation, and is accordingly accounted for in the present method. Accordingly, minimizing $d(\mathbf{c}, \hat{\mathbf{c}})$ involves a constrained minimization problem that can be expressed as $$\min_{B,\Delta,\{\beta_j\};(B-1)\log k + B\log r \leq R} \sum_{j=1}^{B} \sum_{i \in \beta_j} (c_i - \hat{c}_j)^2. \quad [\text{Eq. 5}]$$

It is noted that the minimization space as described includes the standard histogram representation where $\Delta = 2^{-64}$ and log r is effectively 64 bits when floating point precision is used.

In a specific example, the approximation of counts in a bucket can be based on an arithmetic mean of the counts. For example, for all $1 \leq j \leq B$, let $$\bar{c}_j \stackrel{def}{=} \frac{1}{|\beta_j|} \sum_{i \in B_j} c_i \quad [\text{Eq. 6}]$$

denote the mean of the counts in bucket j. Further, let $m_j$ equal the closest integer to $$\frac{\bar{c}_J}{\Delta}.$$

Then for any x $$\sum_{i \in \beta_j} (c_i - x)^2 = \sum_{i \in \beta_j} (c_i - \bar{c}_j + \bar{c}_j - x)^2 \quad [\text{Eq. 7}]$$

$$= \sum_{i \in \beta_j} (c_i - \bar{c}_j)^2 + \sum_{i \in \beta_j} (\bar{c}_j - x)^2$$

$$= \sum_{i \in \beta_j} (c_i - \bar{c}_j)^2 + |\beta_j|(\bar{c}_j - x)^2$$

where the second equality follows from the definition of $\bar{c}_j$. Therefore Eq. 5 can be reduced to $$\min_{B,\Delta,\{\beta_j\};(B-1)\log k + B\log r \leq R} \sum_{j=1}^{B} \left( \sum_{i \in \beta_j} (c_i - \bar{c}_j)^2 + |\beta_j|(\bar{c}_j - \hat{c}_j)^2 \right). \quad [\text{Eq. 8}]$$

Instead of optimizing over both B and $\Delta$ simultaneously, one can make a simplifying assumption that the optimal $\Delta$ is likely to be small relative to n, and that the fractional part of $\bar{c}_j/\Delta$ is approximately uniformly distributed between 0 and 1. This assumption allows $\Delta$ to be fixed as a function of B, so that there is a particular (delta) associated with each possible B. This can reduce the optimization space by allowing each B to be evaluated with respect to the associated precision and to the storage constraint.

For example, for a given B, let $\Delta^*(B)$, $r^*(B)$ denote the minimum value of $\Delta$ and the corresponding maximum value of r that satisfy constraint of Eq. 3. The following simpler minimization problem is presented:

$$\min_{B,\{\beta_j\}_{j=1}^{B}} \sum_{j=1}^{B} \left( \sum_{i \in \beta_j} (c_i - \bar{c}_j)^2 + |\beta_j|(\bar{c}_j - m_j \Delta^*(B))^2 \right). \quad [\text{Eq. 9}]$$

For a given number of buckets B, the part of Eq. 9 that is $$\min_{B,\{\beta_j\}_{j=1}^{B}} \sum_{j=1}^{B} \left( \sum_{i \in \beta_j} (c_i - \bar{c}_j)^2 \right)$$

has been previously addressed using dynamic programming methods. However, such an approach does not accommodate the additional error arising as a result of representing $\bar{c}_j$ to a limited precision. The present technology employs a modified dynamic programming method that accommodates this error. The modified method can be described as follows.

For any interval bounded by a and b, where $1 \leq a \leq b \leq k$, let a Modified Sum Squared Error (MSSE) be defined thusly:

$$MSSE([a,b]) \stackrel{def}{=} \sum_{i=a}^{b} (c_i - AVG([a,b]))^2 + \quad [\text{Eq. 10}]$$

$$(b-a+1)^2 \left( AVG([a,b]) - \left[ \frac{AVG([a,b])}{\Delta} \right] \Delta \right)^2$$

where $$AVG([a,b]) \stackrel{def}{=} \frac{1}{b-a+1} \sum_{i=a}^{b} c_i$$

is the average of $\{c_i\}_{i=a}^{b}$. One could pre-compute $$\sum_{i=1}^{p} c_i \text{ and } \sum_{i=1}^{p} c_i^2$$

for all values of p. This costs O(k) time. This upfront computational cost allows one to compute MSSE([a,b]) and AVG ([a,b]) for any a,b in constant time. Let MSSE*(i,p) denote the minimum sum squared error in the histogram representation of $(c_1, c_2, \ldots, c_i)$ with p buckets and $\Delta^*(B)$ as the precision (B is implicit in the notation). In seeking MSSE*(k,B) a principal observation is that $$MSSE^*(i,p) = \min_{1 \leq i_1 \leq i} \{MSSE^*(i_1, p-1) + MSSE([i_1+1, i])\}. \quad [\text{Eq. 11}]$$

Figure 2:
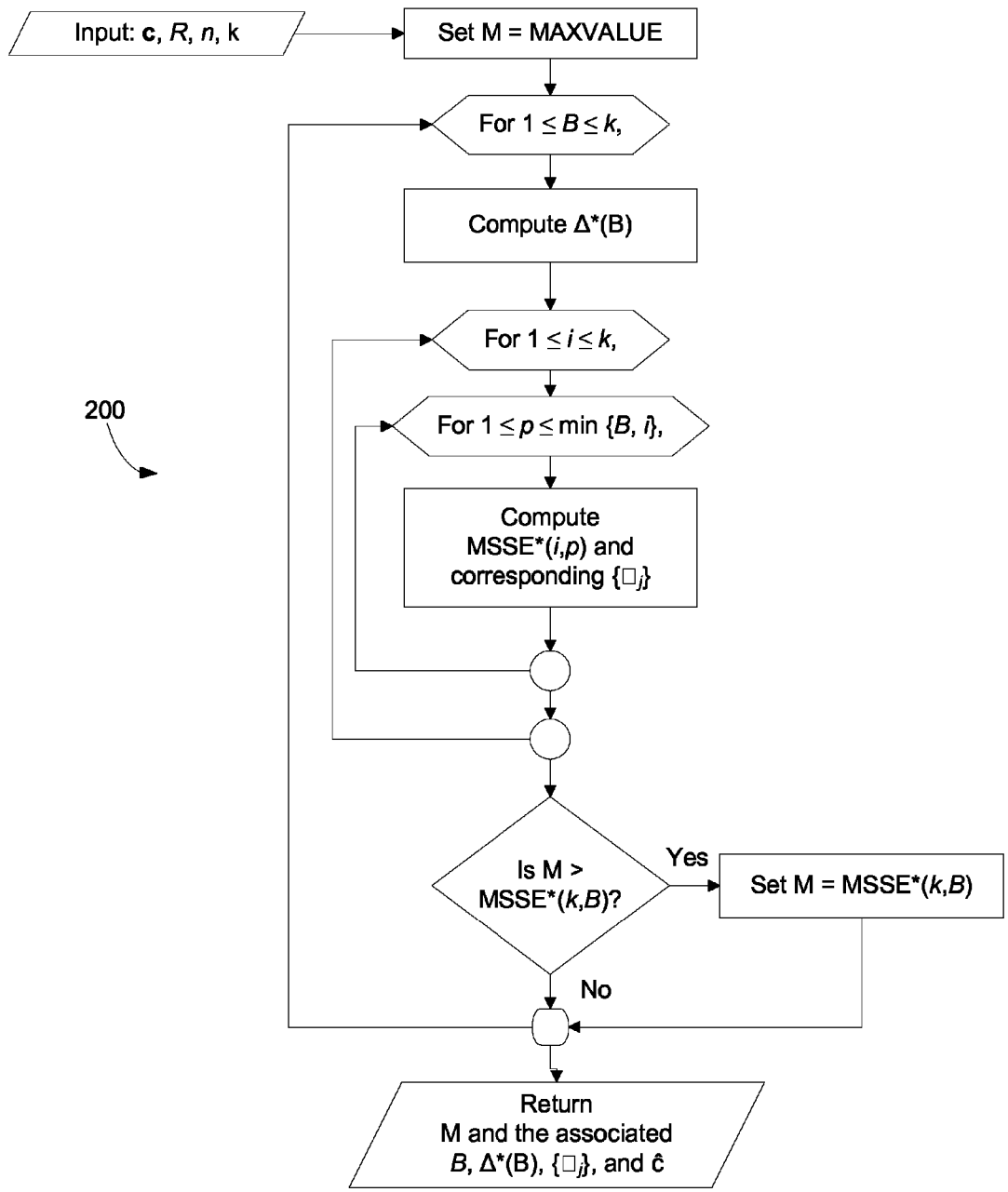
FIG. 2 is a flow diagram illustrating computing steps in a particular example of the method.

To calculate MSSE*(k,B), Equation 11 above can be used to compute MSSE*(i,p) for all $1 \leq i \leq k$ and all $1 \leq p \leq B$, in increasing order of p and for each p in increasing order i. In one aspect, this can include maintaining an error table to store the results of the computation. In a specific example, a table of size kB is maintained, where O(k) computations are performed to compute each entry. Then Equation 9 can be solved by repeating the procedure for $1 \leq B \leq n$ with the appropriate $\Delta$ in each case and then computing $\min_B MSSE^*(k, B)$. An example method 200 to execute the above approach is summarized in FIG. 2.

In another example, rather than a single bucket count, a technique can approximate the count vector in a bucket by using another vector, one that belongs to a pre-determined finite set of vectors. This approach is akin to vector quantization, whereas the above technique is analogous to scalar quantization. In a particular example, the vectors used can come from a pre-determined finite set of dimension $|\beta_j|$. The pre-determined finite set of vectors can in particular be derived from lattices. In one aspect, the set of vectors is a subset of points in a lattice. In such cases, lattice encoding and decoding methods may be employed to identify the vector closest to the count vector being quantized.

According to this example, a lattice in m-dimensions can be defined by a non-singular m×m matrix M so that if v is an m-dimensional vector of integers, the lattice Λ is the set of all vectors of the form Mv. However for purposes of practicing the present method, the non-singularity of M may be relaxed. In a particular aspect, the lattice represents a set of regularly spaced points in m dimensions. It should be noted that any scaling of the lattice (e.g. according to a scaling parameter a) results in another lattice where the points are similarly regularly spaced. The spacing in the scaled lattice is larger or smaller compared to the original lattice depending on whether α is greater or lesser than 1. Lattices are used in vector quantization when a lossy representation of a real-valued vector is sought.

Given a partition of the column $\{1, 2, \ldots, k\}$ into B buckets $\{\mathcal{B}_j\}$, the vector of counts c can be approximated using lattices as follows. Let $\{\Lambda_i\}_{i=1}^{k}$ denote a pre-determined set of lattices where $\Lambda_i$ is a lattice of dimension i. It should be noted that for all scaling parameters α, αΛ$_i$ is also a lattice. Given n and a scaling parameter α, the subset of the lattice αΛ$_i$ that is a valid representation of a count vector of length i, denoted $\tilde{\Lambda}_i$, is defined $$\tilde{\Lambda}_i = \{v=(v_1, v_2, \ldots, v_i) \in \alpha\Lambda_i : v_i \geq 0 \text{ and } \Sigma_l v_l \leq n\}. \quad [\text{Eq. 12}]$$

A greater α will result in fewer points being in $\tilde{\Lambda}_i$ and therefore fewer bits can be used to represent a given point. Thus a trade-off can be made between the number of bits assigned to represent the counts in a bucket and the number of buckets by adjusting α and selecting B to obey a storage constraint. Alternatively a similar trade-off can be made by selecting α with regard to the storage constraint and adjusting B to also meet the constraint. Thus, α can serve an analogous role as a precision factor in this example to that of Δ described above.

In accordance with the example, let $b_1, b_2, \ldots b_{B-1}$ denote the bucket boundaries and let $L_1, L_2, \ldots, L_B$ denote the sizes of the buckets used to partition $\{1, 2, \ldots, k\}$. For $1 \leq j \leq B$, let $\mathbf{c}_j \stackrel{\text{def}}{=} (c_{b_{j-1}+1}, c_{b_{j-1}+2}, \ldots, c_{b_j})$ denote the vector of counts corresponding to bucket j. Then for a given α, the approximate representation of vector c is given by $\hat{\mathbf{c}} = (\hat{\mathbf{c}}_1, \hat{\mathbf{c}}_2, \ldots, \hat{\mathbf{c}}_B)$ where $$\hat{\mathbf{c}}_j = \text{argmin}_{v \in \tilde{\Lambda}_{L_j}} \|v - \mathbf{c}_j\|_2^2$$

(with $\|\cdot\|_2$ denoting a squared-error norm).

Once the bucket boundaries have been specified, the number of bits needed to represent the approximation is log r(α, $\{L_j\}$) where $$r(\alpha, \{L_j\}) \stackrel{\text{def}}{=} \Pi_{j=1}^{B} |\tilde{\Lambda}_{L_j}| \quad [\text{Eq. 13}]$$

with $|\tilde{\Lambda}_{L_j}|$ denoting the cardinality of lattice subsets that approximate the count vector having a length corresponding to the size of bucket j.

As discussed above, for a histogram having B buckets has a storage constraint such as shown in Eq. 2. Instead of optimizing B and α simultaneously, α can be set at α*(B), which denotes the minimum value that satisfies the storage constraint for each B. In a particular example, $$\bar{r}(\alpha, B) \stackrel{\text{def}}{=} \max_{\{L_j\}_{j=1}^{B}: \sum L_j = k} r(\alpha, \{L_j\}) \quad [\text{Eq. 14}]$$

and $$\alpha^*(B) = \min\{\alpha: (B-1)\log k + B\log \bar{r}(\alpha, B) \leq R\}. \quad [\text{Eq. 15}]$$

This value of α allows all possible partitions of $\{1, 2, \ldots, k\}$ into B buckets. As such, when $\{\mathcal{B}_j\}$ is specified this value may be somewhat conservative. However this approach allows for separation of the problem of optimizing the scaling factor from that of identifying the bucket boundaries. It should also be noted that, given n and k, all values α*(B) can be computed in advance for all values of B. In a further aspect, the values of α*(B) can be stored in a precision table. In that case this step will not contribute to the computation time for generating the histogram.

The error in representing count vector c in this manner is $$d(c, \hat{c}) = \sum_{j=1}^{B} \|c_j - \hat{c}_j\|_2^2, \quad [\text{Eq. 16}]$$

where for $1 \leq j \leq B$, $\mathbf{c}_j$ is the sub-vector of counts corresponding to the jth bucket and $\hat{\mathbf{c}}_j$ is the vector used to approximate that sub-vector. In the present method, a histogram is constructed in which this error is minimized, i.e.

$$\min_B \min_{\{\mathcal{B}_j\}_{j=1}^{B}} d(c, \hat{c}). \quad [\text{Eq. 17}]$$

In one aspect, implicit in the inner minimization is that the α corresponding to the lattices used is α*(B). Another aspect is that the α is independent of the bucket boundaries.

The inner minimization can be performed as follows. For any interval bounded by a and b, where $1 \leq a \leq b \leq k$, let $\mathbf{c}$ (a,b) denote the sub-vector $(c_a, c_{a+1}, \ldots c_b)$. Let a Closest Lattice Vector (CLV) be defined as $$\text{CLV}([a,b]) \stackrel{\text{def}}{=} \arg\min_{v \in \tilde{\Lambda}_{b-a+1}} \|\mathbf{v} - \mathbf{c}(a,b)\|_2^2, \quad [\text{Eq. 18}]$$

i.e. the vector in the lattice $\tilde{\Lambda}_{b-a+1}$ that is closest to c(a,b) in terms of the squared-error norm. Further let a Sum Squared Lattice Error(SSLE) be defined as $$\text{SSLE}([a,b]) \stackrel{\text{def}}{=} \min_{v \in \tilde{\Lambda}_{b-a+1}} \|\mathbf{c} - \mathbf{v}(a,b)\|_2^2, \quad [\text{Eq. 19}]$$

i.e. the corresponding minimum squared-error. In contrast to MSSE([a,b]) and AVG([a,b]), here $O(k^3)$ is used to compute CLV([a,b]) and SSLE([a,b]) for all a,b. These can be found using known methods for finding the closest lattice point. Let MSSE*(i,p) denote the minimum sum squared error in a histogram representation of $(C_1, c_2, \ldots c_i)$ with p buckets and α*(B) as the scaling factor. In seeking MSSE*(k,B) it is observed that $$\text{MSSE}^*(i,p) = \min_{1 \leq i_1 \leq i} \{\text{MSSE}^*(i,p-1) + \text{SSLE}^*([i_1+1, i])\}. \quad [\text{Eq. 20}]$$

Figure 3:
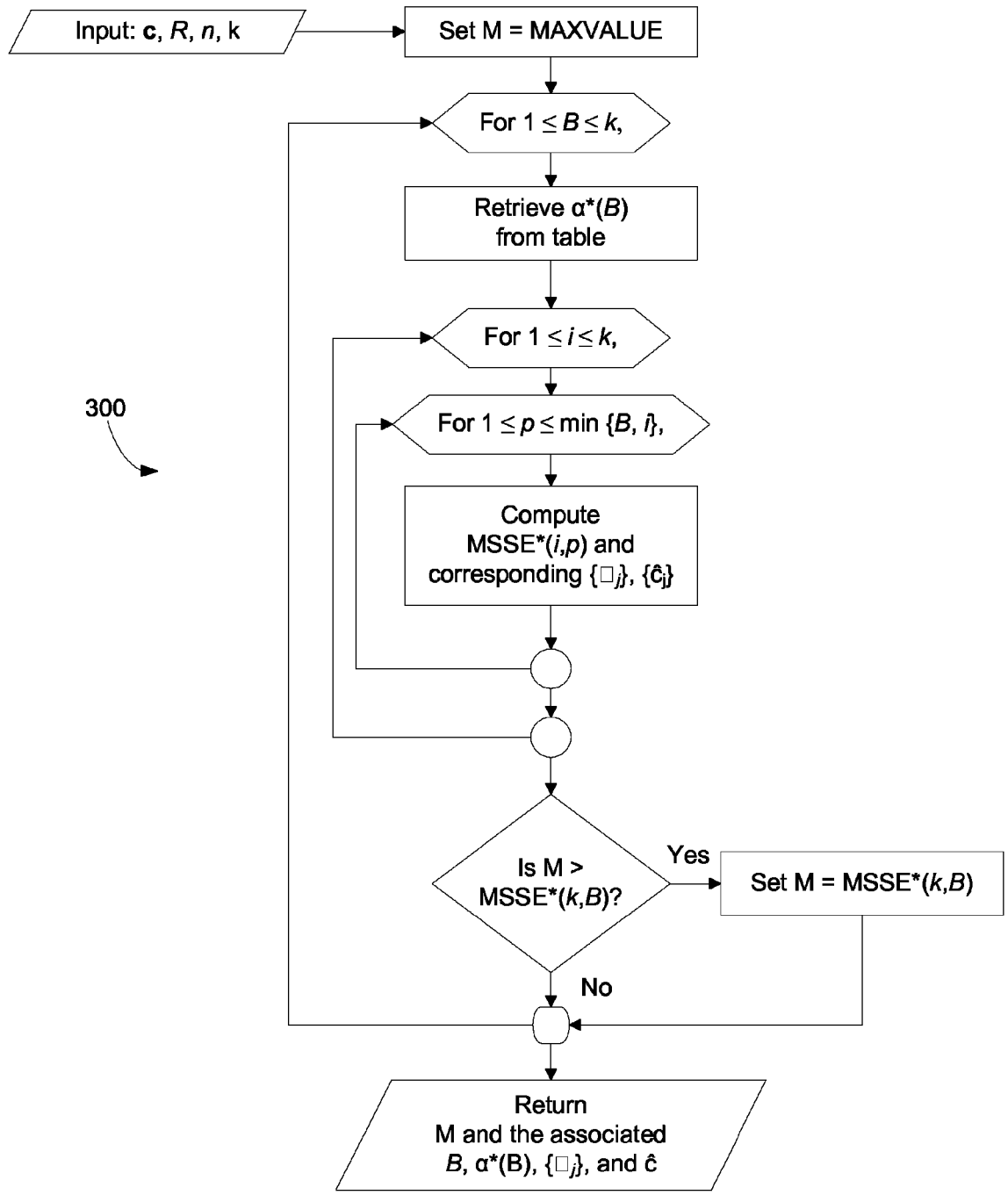
FIG. 3 is a flow diagram illustrating computing steps in another particular example of the method.

To calculate MSSE*(k,B), Eq. 20 can be used to compute MSSE*(i,p) for all $1 \leq i \leq k$ and all $1 \leq p \leq B$, in increasing order of p and for each p in increasing order i. In one aspect, this can include maintaining a table to store the results of the computation. In a specific example, a table of size kB is maintained, where O(k) computations are performed to compute each entry. Then Equation 17 can be solved by repeating the procedure for $1 \leq B \leq n$ with the appropriate α*(B) in each case and then computing $\min_B$ MSSE*(k, B). An example method 300 to execute the above approach is summarized in FIG. 3.

Summarizing and reiterating to some extent, technologies described herein provide a way to represent the distribution of an attribute in a database, while both minimizing representational error and meeting a storage constraint. It is contemplated that such methods can be used in the processing of data in a database, particularly in enhancing query processing. It should be noted that all or portions of the subject technology can be implemented as a system, method, apparatus, or article of manufacture using standard programming and/or engineering techniques to produce software, firmware, hardware or any combination thereof to control a computer to implement the disclosed innovation.

The technology described here can be stored on a computer readable storage medium that includes volatile and non-volatile, removable and non-removable media implemented with any technology for the storage of information such as computer readable instructions, data structures, program modules, or other data. In one example, a computer-readable storage medium can have tangibly stored thereon computer-readable instructions for execution of method for histogram construction as described herein. Computer readable storage media include, but is not limited to, RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which can be used to store the desired information and described technology.

Systems utilizing the methods described herein may also include communication connections or networking apparatus and networking connections that allow devices in the system to communicate with other devices. Communication connections are an example of communication media. Communication media typically embodies computer readable instructions, data structures, program modules and other data in a modulated data signal such as a carrier wave or other transport mechanism and includes any information delivery media. The "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared, and other wireless media. The term computer readable media as used herein includes communication media.

In particular, the instructions can be provided for execution by a processor in a system, such as a query processor. For example, a system for processing data in a database can include a database in which a plurality of attributes is arranged in one or more columns. The system can further comprise one or more processors, particularly a query processor for querying the column according to some predicate. Computer-readable instructions can be provided for execution by the query processor to perform a mapping of the distribution of attributes in accordance with the methods described herein. In a particular aspect, the instructions are provided on a computer-readable medium.

Figure 4:
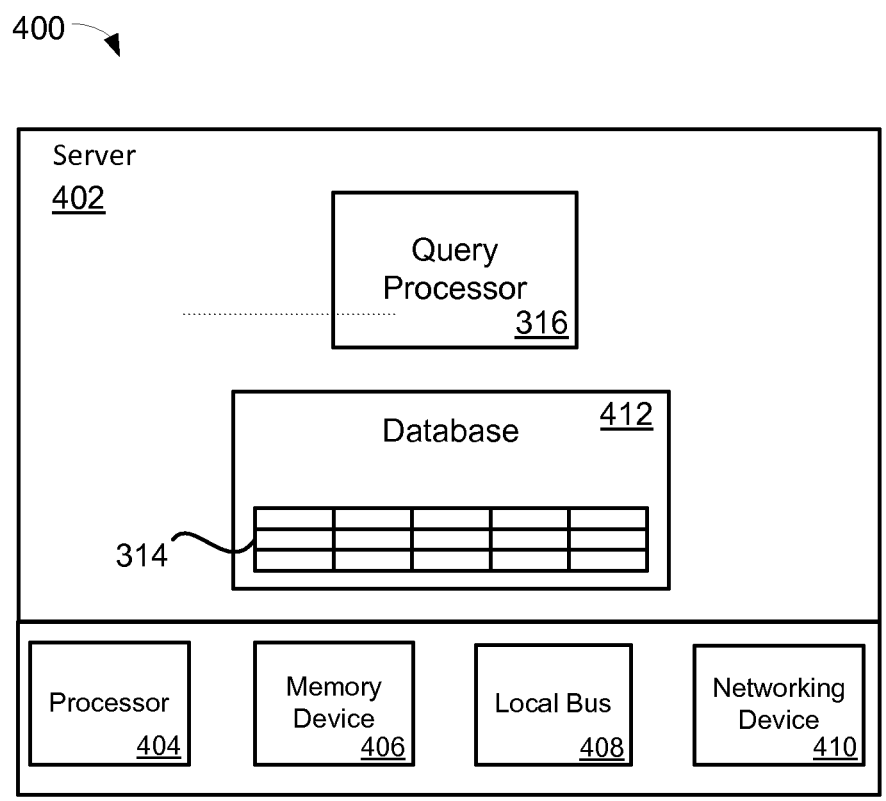
FIG. 4 is a schematic diagram of a system according to an example of the present technology.

In one example of a system for processing data in a database, described in FIG. 4, a system 400 can comprise a server 402 as well as a hardware processor device 404, a hardware memory device 406, a local communication bus 408 to enable communication between hardware devices and components, and a networking device 410 for communication across a network. The server can include a database 412 containing structured data 414, and a query processor 416. The query processor can access the database in response to a query input by a user and execute instructions to create one or more histograms from which an approximate response to the query can be provided. Once created, the count approximations are encoded using a precision according to the method and stored with the bucket set for the database, e.g. on a computer-readable storage medium. The approximations can be stored on the medium with the database, or alternatively on a storage medium external to the database.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the innovation. Accordingly, it is not intended that the innovation be limited, except as by the claims set forth below.

The invention claimed is:

1. A method for constructing a histogram, comprising:
sampling attributes in a column of a database on a server;
determining a bucket set comprising a number of buckets that represents a distribution of the attributes with minimum error, wherein at least one bucket includes boundaries and an approximation of a count of attributes falling within the boundaries;
determining a precision for encoding the approximation, wherein a histogram having the bucket set fits within a storage limit and wherein the precision includes a bit threshold for the approximation of the count of the attributes; and
storing the histogram for the database by encoding the approximation with the precision for encoding the approximation.

2. The method of claim 1, wherein determining the precision for encoding the approximation comprises:
computing a precision value and an error metric for a bucket set;
storing the precision value and the error metric in a table; and
retrieving the precision for encoding the approximation for use in storing the histogram.

3. The method of claim 2, wherein the error metric is a sum squared error.

4. The method of claim 1, wherein the approximation is a scalar representation of the count of attributes.

5. The method of claim 4, wherein the precision for encoding the approximation is such that $$(B-1)\log_2 k + B\log_2\left[\left(\frac{n}{\Delta}+1\right)\right]$$

is no greater than the storage limit, where $\Delta$ is a precision value, B is the number of buckets, (and where n attributes can take on any of k values) k is a number of possible values the attributes, n is the number of attributes.

6. The method of claim 1, wherein the approximation is a vector representation of the count of attributes.

7. The method of claim 6, wherein the approximation is a vector selected from a pre-defined set of vectors.

8. The method of claim 6, wherein the approximation is a vector from a lattice $\tilde{\Lambda}_i$ that approximates a count vector with minimum error.

9. The method of claim 8, wherein the precision for encoding the approximation is $$\min\{\alpha:(B-1)\log k + B\log \bar{r}(\alpha,B) \leq R\},$$

where $\bar{r}(\alpha,B)$ is the number of points in the lattice that can approximate the count vector, $\alpha$ is a scaling factor for lattice $\tilde{\Lambda}_i$, B is the number of buckets, k is a number of possible values for the attributes, and R is the storage limit.

10. The method of claim 1, wherein the attributes are created by converting text data into integers.

11. A non-transitory computer-readable storage medium having tangibly stored thereon computer-readable instructions for execution by a processor to perform a method of mapping a distribution of attributes in a database, comprising:
   determining a bucket set comprising a number of buckets that represents the distribution with minimum error, wherein each bucket contains an approximation of a count of attributes;
   determining a precision for which a histogram comprising the bucket set fits within a storage limit, wherein the precision includes a bit threshold for the approximation of the count of attributes; and
   storing the histogram by encoding the approximation with the precision.

12. The non-transitory computer-readable storage medium of claim 11, wherein determining the precision comprises computing a precision value and an error metric for a bucket set and
   storing the precision value and the error metric in a table;
   retrieving the precision for storing the histogram.

13. The non-transitory computer-readable storage medium of claim 12, wherein the error metric is a sum squared error.

14. The non-transitory computer-readable storage medium of claim 11, wherein the approximation is a scalar representation of the count of attributes.

15. The non-transitory computer-readable storage medium of claim 14, wherein the precision is such that $$(B-1)\log_2 k + B\log_2\left\lceil\left(\frac{n}{\Delta}+1\right)\right\rceil$$

is no greater than the storage limit, where $\Delta$ is a precision value, B is the number of buckets, (and where n attributes can take on any of k values) k is a number of possible values the attributes, and n is the number of attributes.

16. The non-transitory computer-readable storage medium of claim 11, wherein the approximation is a vector representation of the count of attributes.

17. The non-transitory computer-readable storage medium of claim 16, wherein the approximation is a vector selected from a pre-defined set of vectors.

18. The non-transitory computer-readable storage medium of claim 17, wherein the approximation is a vector from a lattice $\tilde{\Lambda}_i$ that approximates a count vector with minimum error.

19. The non-transitory computer-readable storage medium of claim 18, wherein the precision meets $$\min\{\alpha:(B-1)\log k + B\log \bar{r}(\alpha,B) \leq R\}$$

where $\bar{r}(\alpha,B)$ is the number of points in the lattice that can approximate the count vector, $\alpha$ is a scaling factor for lattice $\tilde{\Lambda}_i$, B is the number of buckets, k is a number of possible values for the attributes, and R is the storage limit.

20. A system for processing data in a database, comprising:
   a database that includes plurality of attributes arranged in a column;
   a query processor to query the column;
   a computer-readable storage medium having stored thereon computer-readable instructions for execution by the query processor to perform a method of mapping a distribution of attributes in a database, said method comprising:
   determining a bucket set comprising a number of buckets that represents the distribution with minimum error, wherein each bucket contains an approximation of a count of attributes;
   determining a precision for which a histogram comprising the bucket set fits within a storage limit, wherein the precision includes a bit threshold for the approximation of the count of attributes; and
   storing the histogram by encoding the count approximation with the precision.

* * * * *